(12) United States Patent
Boek et al.

(10) Patent No.: US 9,340,451 B2
(45) Date of Patent: May 17, 2016

(54) MACHINING OF FUSION-DRAWN GLASS LAMINATE STRUCTURES CONTAINING A PHOTOMACHINABLE LAYER

(71) Applicant: Corning Incorporated, Corning, NY (US)

(72) Inventors: Heather Debra Boek, Corning, NY (US); Glen Bennett Cook, Elmira, NY (US); Victoria Ann Edwards, Horseheads, NY (US); Mark Owen Weller, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 147 days.

(21) Appl. No.: 13/798,479

(22) Filed: Mar. 13, 2013

(65) Prior Publication Data
US 2014/0238078 A1 Aug. 28, 2014

Related U.S. Application Data

(60) Provisional application No. 61/770,454, filed on Feb. 28, 2013.

(51) Int. Cl.
*C03C 15/00* (2006.01)
*C03C 21/00* (2006.01)
(Continued)

(52) U.S. Cl.
CPC ................ *C03C 15/00* (2013.01); *C03B 17/02* (2013.01); *C03B 17/064* (2013.01);
(Continued)

(58) Field of Classification Search
CPC .. C03C 23/007; C03C 23/002; C03C 21/002; C03C 15/00; C03B 17/064; C03B 17/02
See application file for complete search history.

(56) References Cited

U.S. PATENT DOCUMENTS 3,673,049 A 6/1972 Giffen et al.
3,737,294 A 6/1973 Dumbaugh, Jr. et al.
(Continued)

FOREIGN PATENT DOCUMENTS

JP 2008216295 7/1980
JP 2000063149 A * 2/2000 .............. C03C 15/00
(Continued)

OTHER PUBLICATIONS

International Search Report, dated Jul. 17, 2014, pp. 1-5, International Patent Application No. PCT/US2014/018496, European Patent Office, The Netherlands.
(Continued)

*Primary Examiner* — Queenie Dehghan
(74) *Attorney, Agent, or Firm* — Michael A. Hood

(57) ABSTRACT

Methods for machining glass structures may be performed on fusion-drawn glass laminates having a core layer interposed between a first cladding layer and a second cladding layer. The core layer may be formed from a core glass composition having a core photosensitivity, the first cladding layer may be formed from a glass composition having a photosensitivity different from the core photosensitivity, and the second cladding layer may be formed from a glass composition having a photosensitivity different from the core photosensitivity. At least one of the core layer, the first cladding layer, and the second cladding layer is a photomachinable layer. The methods may include exposing a selected region of a photomachinable layer in the fusion-drawn laminate to ultraviolet radiation; heating the glass structure until the selected region crystallizes; and removing the crystallized material selectively from the photomachinable layer.

20 Claims, 9 Drawing Sheets

(51) Int. Cl.
*C03C 23/00* (2006.01)
*C03B 17/02* (2006.01)
*C03B 17/06* (2006.01)
*G03F 7/004* (2006.01)
*G03F 7/075* (2006.01)
*G03F 7/38* (2006.01)

(52) U.S. Cl.
CPC ............ *C03C 21/002* (2013.01); *C03C 23/002* (2013.01); *C03C 23/007* (2013.01); *G03F 7/0043* (2013.01); *G03F 7/0757* (2013.01); *G03F 7/38* (2013.01)

(56) References Cited

U.S. PATENT DOCUMENTS

| | | |
|---|---|---|
| 3,746,526 A | 7/1973 | Giffon |
| 3,849,097 A | 11/1974 | Giffen et al. |
| 3,931,438 A | 1/1976 | Beall et al. |
| 4,102,664 A | 7/1978 | Dumbaugh, Jr. |
| 4,130,680 A | 12/1978 | Ference et al. |
| 4,214,886 A | 7/1980 | Shay et al. |
| 4,405,672 A * | 9/1983 | Araujo et al. ............... 428/68 |
| 4,880,453 A | 11/1989 | Coppola et al. |
| 5,342,426 A | 8/1994 | Dumbaugh, Jr. |
| 5,374,291 A * | 12/1994 | Yabe et al. ............... 65/30.11 |
| 5,559,060 A | 9/1996 | Dumbaugh, Jr. et al. |
| 7,132,054 B1 * | 11/2006 | Kravitz et al. ............... 216/11 |
| 7,201,965 B2 | 4/2007 | Gulati et al. |
| 7,241,559 B2 | 7/2007 | Borrelli et al. |
| 7,262,144 B2 | 8/2007 | Schreder et al. |
| 7,514,149 B2 | 4/2009 | Bocko et al. |
| 7,666,511 B2 | 2/2010 | Ellison et al. |
| 7,829,489 B2 | 11/2010 | Borrelli et al. |
| 8,007,913 B2 | 8/2011 | Coppola et al. |
| 8,179,375 B2 | 5/2012 | Ciesla et al. |
| 2004/0126698 A1 | 7/2004 | Borrelli et al. |
| 2011/0195360 A1 | 8/2011 | Flemming et al. |
| 2015/0010739 A1 | 1/2015 | Mauro et al. |
| 2015/0251383 A1 | 9/2015 | Beall et al. |
| 2015/0251949 A1 | 9/2015 | Boek et al. |

FOREIGN PATENT DOCUMENTS

| | | | |
|---|---|---|---|
| JP | 2000178036 | 6/2000 | |
| JP | 2001105398 A * | 4/2001 | ................ B81C 1/00 |
| WO | 2008119080 | 10/2008 | |
| WO | 2014055840 | 4/2014 | |

OTHER PUBLICATIONS

Written Opinion of the International Searching Authority, dated Jul. 17, 2014, pp. 1-6, International Patent Application No. PCT/US2014/018496, European Patent Office, The Netherlands.

* cited by examiner

MACHINING OF FUSION-DRAWN GLASS LAMINATE STRUCTURES CONTAINING A PHOTOMACHINABLE LAYER

CROSS-REFERENCE TO RELATED APPLICATIONS

This application claims the benefit of priority under 35 U.S.C. §119 of U.S. Provisional Application Ser. No. 61/770,454, filed Feb. 28, 2013, the content of which is relied upon and incorporated herein by reference in its entirety.

FIELD

The present disclosure generally relates to fusion-drawn glass laminate structures and, more particularly, to methods for machining fusion-drawn glass laminate structures that include at least one photomachinable layer.

TECHNICAL BACKGROUND

Fusion-drawn core-clad glass laminates have numerous uses in the electronics and optics industries. The formation of structures such as holes and through-holes through the laminates can be challenging and imprecise, particularly using techniques such as laser drilling. Accordingly, ongoing needs exist for fusion-drawn core-clad glass laminates having properties amenable to creating simple and complex structures including but not limited to holes and through-holes, and also for methods of machining the structures into the fusion-drawn core-clad glass laminates.

SUMMARY

According to various embodiments, methods for machining glass structures are disclosed. The methods according to the various embodiments may be performed on glass structures including, but not limited to, fusion-drawn laminates having a core layer interposed between a first cladding layer and a second cladding layer. In the fusion-drawn laminates, the core layer may be formed from a core glass composition having a core photosensitivity, the first cladding layer may be formed from a first-clad glass composition having a first-clad photosensitivity different from the core photosensitivity, and the second cladding layer may be formed from a second-clad glass composition having a second-clad photosensitivity that is different from the core photosensitivity. At least one of the core layer, the first cladding layer, and the second cladding layer is a photomachinable layer. The methods may include exposing at least one selected region of at least one photomachinable layer in the fusion-drawn laminate to ultraviolet radiation for a predetermined exposure time; heating the glass structure until the at least one selected region forms a crystallized region of crystallized material in the photomachinable layer; and removing the crystallized region selectively from the photomachinable layer.

Additional features and advantages of the embodiments described herein will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

DETAILED DESCRIPTION

Reference will now be made in detail to embodiments of methods for machining glass structures. First the glass structures themselves will be described with reference to FIGS. 1 and 2. Various methods for machining the glass structures will be described below with reference to FIGS. 3A-10E.

As used herein, the term "liquidus viscosity" refers to the shear viscosity of the glass composition at its liquidus temperature.

As used herein, term "liquidus temperature" refers to the highest temperature at which devitrification occurs in the glass composition.

As used herein, the term "CTE" refers to the coefficient of thermal expansion of the glass composition averaged over a temperature range from about 20° C. to about 300° C.

The term "substantially free," when used to described the absence of a particular oxide component in a glass composition, means that the component is present in the glass composition as a contaminant in a trace amount of less than 1 mol. %.

For glass compositions described herein as components of glass structures, the concentration of constituent components (e.g., $SiO_2$, $Al_2O_3$, $Na_2O$ and the like) of the glass compositions are given in mole percent (mol. %) on an oxide basis, unless otherwise specified. Glass compositions disclosed herein have a liquidus viscosity which renders them suitable for use in a fusion draw process and, in particular, for use as a glass cladding composition or a glass core composition in a fusion laminate process. As used herein, unless noted otherwise, the terms "glass" and "glass composition" encompass both glass materials and glass-ceramic materials, as both classes of materials are commonly understood. Likewise, the term "glass structure" should be understood to encompass structures containing glasses, glass ceramics, or both.

Figure 1:
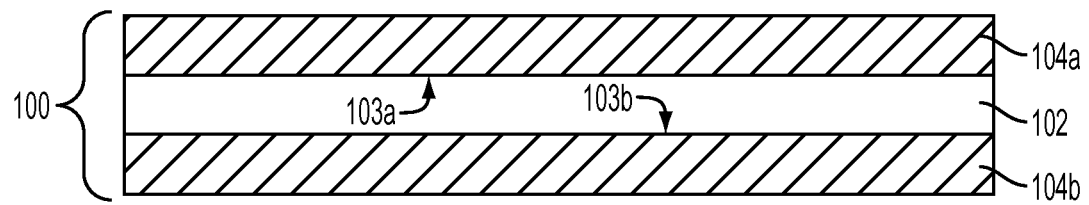
FIG. 1 schematically depicts a cross section of a glass structure according to one or more embodiments shown and described herein.

Examples of glass structures for use in methods for machining glass structures now will be described. Embodiments of methods for machining the glass structures will be described below. Referring to FIG. 1, glass compositions suitable for use in fusion-draw processes, including but not limited to those described herein, may be used to form an article, such as the glass structure 100 schematically depicted in cross section in FIG. 1. The glass structure 100 generally comprises a core layer 102 formed from a core glass composition. The core layer 102 may be interposed between a pair of cladding layers such as a first cladding layer 104a and a second cladding layer 104b. The first cladding layer 104a and the second cladding layer 104b may be formed from a first cladding glass composition and a second cladding glass composition, respectively. In some embodiments, the first cladding glass composition and the second cladding glass composition may be the same material. In other embodiments, the first cladding glass composition and the second cladding glass composition may be different materials.

FIG. 1 illustrates the core layer 102 having a first surface 103a and a second surface 103b opposed to the first surface 103a. A first cladding layer 104a is fused directly to the first surface 103a of the core layer, 102 and a second cladding layer 104b is fused directly to the second surface 103b of the core layer 102. The glass cladding layers 104a, 104b are fused to the core layer 102 without any additional materials, such as adhesives, polymer layers, coating layers or the like being disposed between the core layer 102 and the cladding layers 104a, 104b. Thus, the first surface 103a of the core layer 102 is directly adjacent the first cladding layer 104a, and the second surface 103b of the core layer 102 is directly adjacent the second cladding layer 104b. In some embodiments, the core layer 102 and the glass cladding layers 104a, 104b are formed via a fusion lamination process. Diffusive layers (not shown) may form between the core layer 102 and the cladding layer 104a, or between the core layer 102 and the cladding layer 104b, or both.

In some embodiments, the cladding layers 104a, 104b of the glass structures 100 described herein may be formed from a first glass composition having an average cladding coefficient of thermal expansion $CTE_{clad}$, and the core layer 102 may be formed from a second, different glass composition which has an average coefficient of thermal expansion $CTE_{core}$. In some embodiments, the glass compositions of the cladding layers 104a, 104b may have liquidus viscosities of at least 20 kPoise. In some embodiments, the glass compositions of the core layer 102 and the cladding layers 104a, 104b may have liquidus viscosities of less than 250 kPoise.

Figure 2:
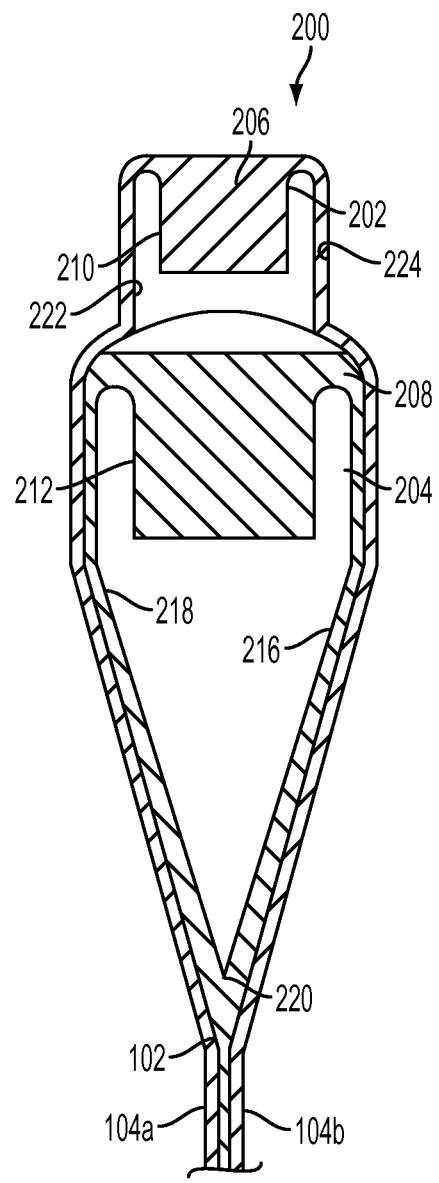
FIG. 2 schematically depicts a fusion draw process for making the glass structure of FIG. 1.

Specifically, the glass structure 100 according to some embodiments herein may be formed by a fusion lamination process such as the process described in U.S. Pat. No. 4,214,886, which is incorporated herein by reference. Referring to FIG. 2 by way of example and further illustration, a laminate fusion draw apparatus 200 for forming a laminated glass article may include an upper isopipe 202 that is positioned over a lower isopipe 204. The upper isopipe 202 may include a trough 210, into which a molten cladding composition 206 may be fed from a melter (not shown). Similarly, the lower isopipe 204 may include a trough 212, into which a molten glass core composition 208 may be fed from a melter (not shown). In the embodiments described herein, the molten glass core composition 208 has an appropriately high liquidus viscosity to be run over the lower isopipe 204.

As the molten glass core composition 208 fills the trough 212, it overflows the trough 212 and flows over the outer forming surfaces 216, 218 of the lower isopipe 204. The outer forming surfaces 216, 218 of the lower isopipe 204 converge at a root 220. Accordingly, the molten core composition 208 flowing over the outer forming surfaces 216, 218 rejoins at the root 220 of the lower isopipe 204, thereby forming a core layer 102 of a laminated glass structure.

Simultaneously, the molten composition 206 overflows the trough 210 formed in the upper isopipe 202 and flows over outer forming surfaces 222, 224 of the upper isopipe 202. The molten composition 206 has a lower liquidus viscosity requirement to be run on the upper isopipe 202, and will have a CTE either equal to or less than the glass core composition 208 when present as a glass. The molten cladding composition 206 is outwardly deflected by the upper isopipe 202 such that the molten cladding composition 206 flows around the lower isopipe 204 and contacts the molten core composition 208 flowing over the outer forming surfaces 216, 218 of the lower isopipe, fusing to the molten core composition and forming cladding layers 104a, 104b around the core layer 102.

In the laminated sheet so formed, the clad thickness will also be significantly thinner than the core thickness so that the clad goes into compression and the core into tension. But because the CTE difference is low, the magnitude of the tensile stress in the core will be very low (for example, on the order of 10 MPa or lower) which will allow for the production of a laminated sheet that will be relatively easy to cut off the draw due to its low levels of core tension. Sheets can thus be cut from the laminate structure that is drawn from the fusion draw apparatus. After the sheets are cut, the cut product can then be subjected to a suitable UV light treatment(s), as will be described below in the context of methods for machining the glass structure 100.

As illustrative embodiments, the processes for forming glass structures by fusion lamination described herein with reference to FIGS. 1 and 2 and in U.S. Pat. No. 4,214,886 may be used for preparing glass structures 100 in which the glass cladding layers 104a, 104b have the same glass composition. In other embodiments, the glass cladding layers 104a, 104b of the glass structure 100 may be formed from different glass compositions. Non-limiting exemplary processes suitable for forming glass structures having glass cladding layers of different compositions are described in commonly-assigned U.S. Pat. No. 7,514,149, which is incorporated herein by reference in its entirety.

The laminated glass articles and glass structures disclosed herein may be employed in a variety of consumer electronic devices including, without limitation, mobile telephones, personal music players, tablet computers, LCD and LED displays, automated teller machines and the like. In some embodiments, the laminated glass article may comprise one or more layers that are opaque, transparent, or translucent, such as a clad derived from a glass composition wherein the clad layer is opaque, transparent or translucent after heat treatment(s). In some embodiments, the glass structures may be sheet-glass structures.

Having described non-limiting exemplary forms of glass structures 100 containing fusion-drawn laminates with a core layer 102 and cladding layers 104a, 104b, methods for machining the glass structures 100 will now be described. Referring to FIG. 1, in exemplary methods for machining a glass structure 100, the glass structure 100 may include a fusion-drawn laminate of a core layer 102 interposed between a first cladding layer 104a and a second cladding layer 104b. The core layer 102 may be formed from a core glass composition having a core photosensitivity. The first cladding layer 104a may be formed from a first-clad glass composition having a first-clad photosensitivity different from the core photosensitivity. The second cladding layer may be formed from a second-clad glass composition having a second-clad photosensitivity that is also different from the core photosensitivity. In some embodiments, the first-clad glass composition and the second-clad composition may be identical. In other embodiments, the first-clad glass composition and the second-glad glass composition may be different. In such embodiments, the first-clad photosensitivity and the second-clad photosensitivity may be the same or different.

In some embodiments, any or all of the core glass composition, the first-clad glass composition, and the second-clad glass composition may be photosensitive glass compositions. Photosensitive glass compositions compose a class of glass or glass ceramic materials that undergo a change in crystallinity properties when the photosensitive glass composition is exposed to radiation such as UV radiation, for example. In some photosensitive glass compositions, the change in crystallinity may result directly from the exposure to the radiation. In other photosensitive glass compositions, the exposure to the radiation may cause undetectable physical changes to the glass composition, such as the formation of nucleation centers. In such photosensitive glass compositions, once the nucleation centers are formed, the change to crystallinity may be completed by applying a heat treatment to the glass composition.

The photosensitivity of a particular glass varies with respect to the actual composition of the photosensitive glass. Not all glass compositions are photosensitive and, as such, truly non-photosensitive glasses shall be described herein as having a photosensitivity of zero. Likewise, glass compositions that do exhibit photosensitivity shall be defined as having a nonzero photosensitivity. Unless stated otherwise, glass compositions herein said to have a "core photosensitivity," a "first-clad photosensitivity," or a "second-clad photosensitivity do not necessarily exhibit photosensitivity and may have a zero photosensitivity (i.e., may be non-photosensitive) or a nonzero photosensitivity (i.e., may be exhibit photosensitivity).

Relative photosensitivities of two glass compositions having nonzero photosensitivities may be determined objectively. For example, sheets of each composition with equal thicknesses may be exposed to radiation such as UV radiation for various periods of time, followed by heat treatment, to determine the minimum radiation exposure times that enable the secondary crystalline phase to form through the entire thickness of each sheet after the heat treatment. As applicable to embodiments described herein, a first photosensitive glass composition having a shorter minimum radiation exposure time than a second photosensitive glass composition shall be considered to have a photosensitivity greater than that of the second photosensitive glass composition. Conversely, a first photosensitive glass composition having a longer minimum radiation exposure time than a second photosensitive glass composition shall be considered to have a photosensitivity less than that of the second photosensitive glass composition.

The photosensitive and/or photomachinable glass compositions suitable for use herein may include, as non-limiting examples, alkaline-earth aluminoborosilicate glasses, zinc borosilicate glasses, and soda-lime glass. The photosensitive and/or photomachinable glass compositions may also include glass ceramics such as glasses enriched with magnesium oxide, yttria, beryllia, alumina, or zirconia. Illustrative photosensitive glass compositions suitable for use in embodiments herein include those described in U.S. Pat. Nos. 7,241,559; 7,262,144; and 7,829,489, all of which are incorporated herein by reference. In some embodiments, FOTOFORM®, available from Corning Incorporated, may be a suitable photosensitive glass composition. The FOTOFORM® glass has a composition of 79.3 wt. % $SiO_2$, 1.6 wt. % $Na_2O$, 3.3 wt. % $K_2O$, 0.9 wt. % $KNO_3$, 4.2 wt. % $Al_2O_3$, 1.0 wt. % ZnO, 0.0012 wt. % Au, 0.115 wt. % Ag, 0.015 wt. % $CeO_2$, 0.4 wt. % $Sb_2O_3$, and 9.4 wt. % $Li_2O$. Other nonlimiting exemplary photosensitive glasses suitable for use in embodiments described herein are provided in TABLE 1 below.

TABLE 1

Exemplary Photosensitive Glass Compositions

| Composition (wt %) | | | | | | | | | | | |
|---|---|---|---|---|---|---|---|---|---|---|---|
| $SiO_2$ | 76.5 | 78.7 | 74.21 | 73.86 | 71.57 | 71.2 | 77.63 | 71.70 | 72.39 | 73.09 | 73.78 |
| $Al_2O_3$ | 8.78 | 4.82 | 6.18 | 7.58 | 8.05 | 8 | 8.95 | 8.14 | 8.27 | 8.40 | 8.53 |
| $Li_2O$ | 9.23 | 7.5 | 6.55 | 6.53 | 6.19 | 5.78 | 8.56 | 6.93 | 7.96 | 8.99 | 10.02 |
| $Na_2O$ | 1.21 | 1.51 | 1.67 | 1.62 | 2.63 | 2.6 | 1.10 | 2.38 | 2.14 | 1.90 | 1.66 |
| $K_2O$ | 2.34 | 6.53 | 6.62 | 6.01 | 4.92 | 5.72 | 2.15 | 5.37 | 4.72 | 4.07 | 3.42 |
| BaO | 0 | 0 | 3.11 | 3.11 | 6.23 | 6.17 | 0 | 4.90 | 3.68 | 2.45 | 1.23 |
| ZnO | 1.64 | 0.47 | 1.18 | 0.89 | 0.29 | 0.28 | 1.61 | 0.57 | 0.83 | 1.09 | 1.35 |
| $CeO_2$ | 0.01 | 0.007 | 0.017 | 0.011 | 0.013 | 0.014 | 0.013 | 0.015 | 0.014 | 0.014 | 0.013 |
| $SnO_2$ | 0 | 0.03 | 0.03 | 0.03 | 0.03 | 0.03 | 0 | 0.002 | 0.002 | 0.001 | 6E-04 |
| $Sb_2O_3$ | 0.22 | 0.46 | 0.58 | 0.52 | 0.5 | 0.5 | 0.22 | 0.442 | 0.387 | 0.331 | 0.276 |
| Ag | 0.1 | 0.088 | 0.088 | 0.087 | 0.086 | 0.077 | 0.081 | 0.10 | 0.09 | 0.09 | 0.08 |
| Au | 0.0001 | 0.001 | 0.001 | 0.001 | 0.001 | 0.001 | 0.001 | 0.001 | 0.001 | 0.001 | 0.001 |
| Composition (mole %) | | | | | | | | | | | |
| SiO2 | 73.5 | 76.7 | 74.9 | 74.7 | 73.6 | 73.8 | 74.8 | 72.7 | 72.1 | 71.4 | 70.8 |
| Al2O3 | 5.0 | 2.8 | 3.7 | 4.5 | 4.9 | 4.9 | 5.1 | 4.9 | 4.8 | 4.8 | 4.8 |
| Li2O | 17.7 | 14.6 | 13.2 | 13.2 | 12.7 | 12.0 | 16.5 | 14.1 | 15.9 | 17.6 | 19.2 |
| Na2O | 1.1 | 1.4 | 1.6 | 1.6 | 2.6 | 2.6 | 1.0 | 2.3 | 2.1 | 1.8 | 1.5 |
| K2O | 1.4 | 4.1 | 4.3 | 3.9 | 3.2 | 3.8 | 1.3 | 3.5 | 3.0 | 2.5 | 2.1 |
| BaO | 0 | 0 | 1.2 | 1.2 | 2.5 | 2.5 | 0 | 2.0 | 1.4 | 0.9 | 0.5 |
| ZnO | 1.2 | 0.3 | 0.9 | 0.7 | 0.2 | 0.2 | 1.2 | 0.4 | 0.6 | 0.8 | 1.0 |
| CeO2 | 0.003 | 0.003 | 0.006 | 0.004 | 0.005 | 0.005 | 0.004 | 0.005 | 0.005 | 0.005 | 0.004 |

TABLE 1-continued

Exemplary Photosensitive Glass Compositions

| | | | | | | | | | | | |
|---|---|---|---|---|---|---|---|---|---|---|---|
| SnO2 | 0 | 0.012 | 0.012 | 0.012 | 0.012 | 0.012 | 0 | 0.001 | 0.001 | 0.004 | 0.0002 |
| Sb2O3 | 0.04 | 0.090 | 0.120 | 0.109 | 0.106 | 0.107 | 0.040 | 0.092 | 0.079 | 0.067 | 0.055 |
| Ag | 0.050 | 0.048 | 0.049 | 0.049 | 0.049 | 0.044 | 0.043 | 0.056 | 0.050 | 0.049 | 0.043 |
| Au | 0.00003 | 0.0003 | 0.0003 | 0.0003 | 0.0003 | 0.0003 | 0.0003 | 0.0003 | 0.0003 | 0.0003 | 0.0003 |
| 0-300° C. CTE | 75 | 80.9 | 80.2 | 77.1 | 80.0 | 81.3 | 68.4 | 80.4 | 80.1 | 80.1 | 79.9 |
| 24 hour Liquidus (° C.) | 940 | 880 | 850 | 860 | 840 | 840 | 950 | 855 | 870 | 885 | 890 |
| Liquidus Viscosity (kP) | 20 | 71 | 123 | 119 | 220 | 140 | 38 | 99 | 56 | 34 | 25 |

According to some embodiments, in the fusion-drawn laminate of the glass structure, at least one of the core layer 102, the first cladding layer 104a, and the second cladding layer 104b is a photomachinable layer. In this regard, the glass composition from which the at least one photomachinable layer among the core layer 102, the first cladding layer 104a, and the second cladding layer 104b, is a photomachinable glass composition. As used herein, the term "photomachinable glass composition" refers to a glass composition having a nonzero photosensitivity, such that the glass composition forms a secondary crystalline phase after exposure of the glass composition to radiation (such as UV radiation, for example) and, optionally, a heat treatment.

Additionally, in photomachinable glass compositions, the secondary crystalline phase that forms after radiation exposure and optional heat treatment is capable of being selectively removed by a physical or chemical procedure such as selective etching. To illustrate, selective removal of the secondary crystalline phase may be enabled by differences in solubility in an etchant medium such as hydrofluoric acid of the secondary crystalline phase to the portions of the glass composition unexposed to radiation. The solubility difference may result in an etch-rate difference, whereby the secondary crystalline phase may etch at least 1.5 times faster, at least 2 times faster, at least 5 times faster, at least 10 times faster, at least 20 times faster, or even at least 100 times faster than the portions of material not exposed to radiation. This feature of etch-rate and/or solubility differentiation may or may not be present in all photosensitive glass compositions. Thus, as the terms are used herein, all photomachinable glass compositions are photosensitive glass compositions with a nonzero photosensitivity, but photosensitive glass compositions are not necessarily photomachinable. Moreover, though in some embodiments one or more of the core layer 102, the first cladding layer 104a, and the second cladding layer 104b may be neither photosensitive nor photomachinable, in such embodiments at least one of the core layer 102, the first cladding layer 104a, and the second cladding layer 104b is both photosensitive and photomachinable.

According to various embodiments of methods for machining a glass structure 100 such as those described above, the machining may include exposing at least one selected region of at least one photomachinable layer in the fusion-drawn laminate to ultraviolet radiation for a predetermined exposure time. The machining may further include heating the glass structure until the at least one selected region forms a crystallized region of crystallized material in the photomachinable layer. The machining may further include removing the crystallized region selectively from the photomachinable layer. The above components of the methods for machining the glass structure 100 will be described in general now, and specific illustrative embodiments of the components to the methods will be described in detail below.

In illustrative embodiments, the at least one selected region of at least one photomachinable layer in the fusion-drawn laminate is exposed to ultraviolet radiation for a predetermined exposure time. In some embodiments, the at least one selected region may include one contiguous region or multiple non-contiguous regions. In other embodiments, the at least one selected region may include the entire photomachinable layer. In illustrative embodiments, the at least one selected region may include a portion of the first cladding layer 104a, a portion of the second cladding layer 104b, the entire first cladding layer 104a, the entire second cladding layer 104b, or a combination of these. It should be understood that when an entire layer is exposed to the UV radiation, after a heat treatment and subsequent selective removal described below, the layer or layers that are completely exposed may be completely removed from the glass structure 100 and function as sacrificial layers.

During the UV exposure, according to some embodiments the ultraviolet radiation 120 may have a wavelength of from about 100 nm to about 400 nm, for example from about 290 nm to about 330 nm. The predetermined exposure time may range from 5 seconds to several hours, such as from about 3 minutes to about 2 hours. In some embodiments, the intensity of the ultraviolet radiation may be varied to affect the kinetics of the physical processes that enable the secondary phase formation during the subsequent heat treatment. The depth to which the ultraviolet radiation enables the secondary phase formation in a given glass structure may depend on the wavelength of the UV radiation, the length of the exposure time, and the intensity of the exposure.

In illustrative embodiments, the heating of the glass structure may be conducted after the exposure to the ultraviolet radiation. The heating may proceed at least until the at least one selected region forms a crystallized region of crystallized material in the photomachinable layer. In some embodiments, the heating may be conducted at temperatures of from about 300° C. to about 900° C., depending on the composition of the photomachinable layer. For example, some photomachinable compositions may be heat treated at temperatures of from about 300° C. to about 500° C., or from about 500° C. to about 650° C.

In illustrative embodiments, removing the crystallized region selectively from the photomachinable layer includes taking advantages of one or both of a differential solubility or a differential etch-rate of the secondary crystalline phase compared to that of the unexposed photomachinable material. Removing the crystallized region may include etching techniques such as immersion, ultrasonic etching, or spraying, for example, in a suitable etchant such as hydrofluoric acid, for example. With regard to etchants, it should be understood that any etchant may be used, in which the secondary crystalline phase has a solubility or etch-rate differential from that of the unexposed photomachinable material such as 5 times greater, 10 times greater, 20 times greater, or even 100 times greater.

As described above, if an entire layer such as the first cladding layer 104a, the second cladding layer 104b, or both is exposed to the UV radiation, the selective removal process may result in the removal of the entire layer, which thereby functions as a sacrificial layer.

Specific illustrative embodiments of methods for machining glass structures and including the general exposing, heating, and removing actions described above will now be described with reference to FIGS. 3A-10E.

Figure 3A:
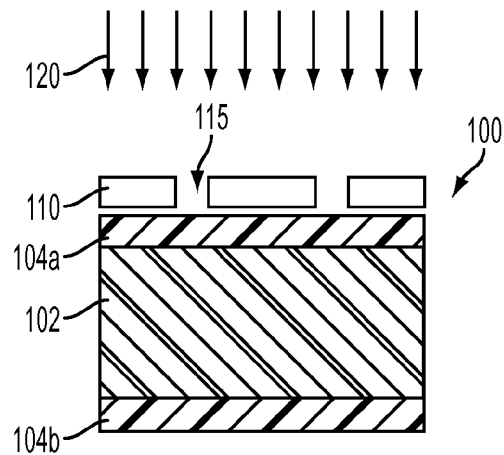
FIGS. 3A-3D schematically depict an embodiment of a method for machining the glass structure of FIG. 1.
Figure 3B:
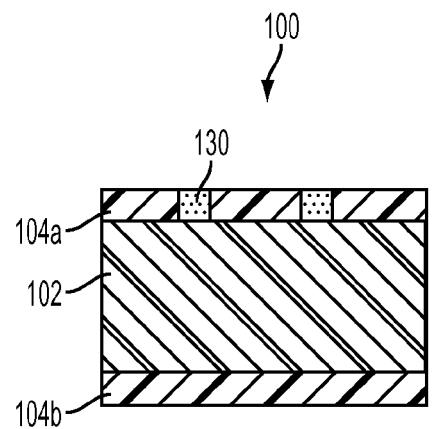
Figure 3C:
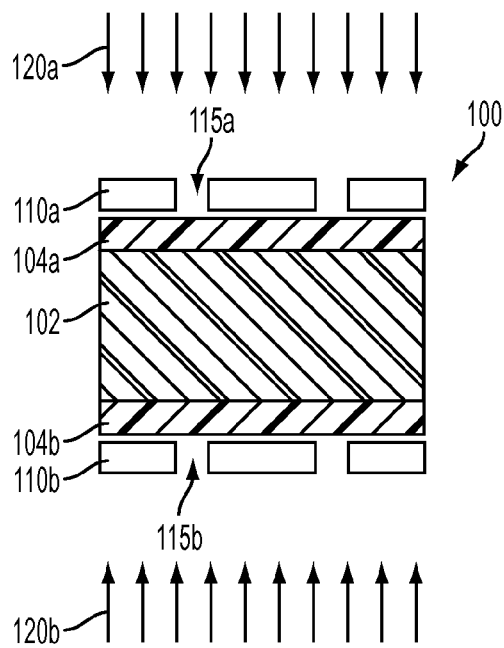
Figure 3D:
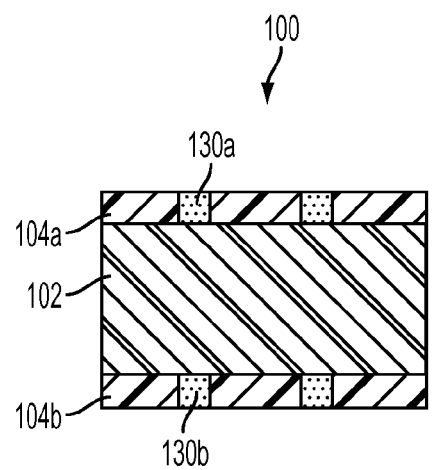

Referring first to FIGS. 3A and 3C, the glass structure 100 may include a core layer 102 interposed between a first cladding layer 104a and a second cladding layer 104b. The core layer may have a core photosensitivity that is less than a first-clad photosensitivity of the first cladding layer 104a and a second-clad photosensitivity of the second cladding layer 104b. The first-clad photosensitivity and the second-clad photosensitivity may be the same or different. In the embodiments of FIGS. 3A and 3B, at least the first cladding layer 104a is photomachinable. In the embodiments of FIGS. 3C and 3D, at least the first cladding layer 104a and the second cladding layer 104b are photomachinable. The core layer 102 in each embodiment may have a photosensitivity of zero or a nonzero photosensitivity and may or may not be photomachinable.

In the embodiment of FIG. 3A, the first cladding layer 104a is exposed to the UV radiation 120 through a photomask 110 having apertures 115 that define the selected regions of the first cladding layer 104a to be exposed to the UV radiation 120. Heat treatment of the glass structure 100 may result in the glass structure 100 of FIG. 3B, in which crystallized regions 130 have formed in locations corresponding to the apertures 115 in the photomask 110. Because the core layer photosensitivity is less than the first-clad photosensitivity, at least one of the exposure to the UV radiation 120 depicted in FIG. 3A or the heat treatment parameters used to form the glass structure 100 of FIG. 3B, is insufficient to enable formation of crystallized regions in the core layer 102. It should be understood that the UV radiation 120 may penetrate into or through the core layer 102 and also may penetrate into or through the second cladding layer 104b. As such, in some embodiments if the first-clad photosensitivity and the second-clad photosensitivity are significantly greater than the core photosensitivity, a single UV exposure from one side of the glass structure 100 as shown in FIG. 3A and followed by heat treatment may result in the glass structure 100 of FIG. 3D with crystallized regions 130a, 130b in both the first cladding layer 104a and the second cladding layer 104b.

In the embodiment of FIG. 3C, the first cladding layer 104a is exposed to the UV radiation 120a through a first photomask 110a having apertures 115a that define the selected regions of the first cladding layer 104a to be exposed to the UV radiation 120a. Likewise, the second cladding layer 104b is exposed to the UV radiation 120b through a second photomask 110b having apertures 115b that define the selected regions of the second cladding layer 104b to be exposed to the UV radiation 120b. Though the apertures 115a, 115b of the first photomask 110a and 110b may be vertically aligned in some embodiments, they do not need to be vertically aligned. It should be understood that the UV radiation 120a, 120b may penetrate into or even through the core layer 102. Heat treatment of the glass structure 100 may result in the glass structure 100 of FIG. 3D, in which crystallized regions 130a, 130b have formed in locations corresponding to the apertures 115a, 115b in the first photomask 110a and the second photomask 110b. Because the core layer photosensitivity is less than the first-clad photosensitivity, at least one of the exposure to the UV radiation 120a, 120b depicted in FIG. 3C or the heat treatment parameters used to form the glass structure 100 of FIG. 3D, is insufficient to enable formation of crystallized regions in the core layer 102.

Figure 4A:
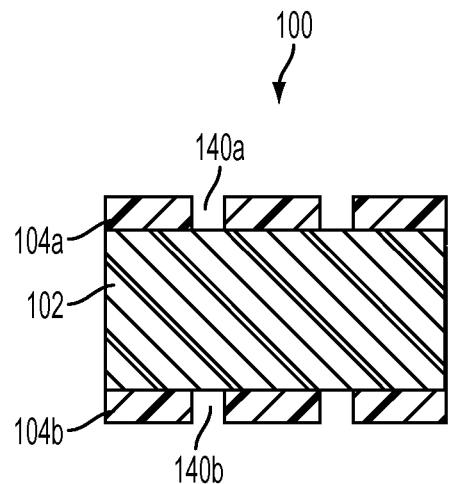
FIGS. 4A-4B schematically depict an embodiment of additional machining steps performed on the glass structure of FIG. 3D.

The glass structure 100 of FIG. 3D may be further processed by selectively removing the crystallized regions 130a, 130b from the first cladding layer 104a and the second cladding layer 104b by a suitable technique such as etching, for example. The resulting structure after such a removal is shown in FIG. 4A, in which hole structures 140a, 140b remain in the first cladding layer 104a and the second cladding layer 104b. In some embodiments, the hole structures 140a, 140b are substantially circular in shape. Without intent to be bound by theory, it is believed that the selective removal of crystalline regions of photomachinable glass compositions may facilitate formation of substantially circular hole structures 140a, 140b with precision unattainable from customary selective removal or etching techniques.

Figure 4B:
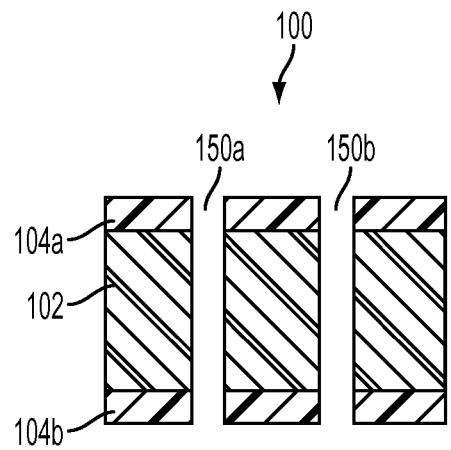

Referring to FIG. 4B, if the hole structures 140a, 140b are vertically aligned in the glass structure 100, a physical or chemical etching technique may be used to remove the portions of the core layer 102 between the hole structures 140a, 140b, thereby forming through-holes 150a, 150b, which may function as via holes, for example. Thus, in some embodiments, the methods for machining the glass structure 100 may include etching the core layer 102 through hole structures 140a, 140b in the first cladding layer 104a and the second cladding layer 104b to form through-holes 150a, 150b in the glass structure 100.

Figure 5A:
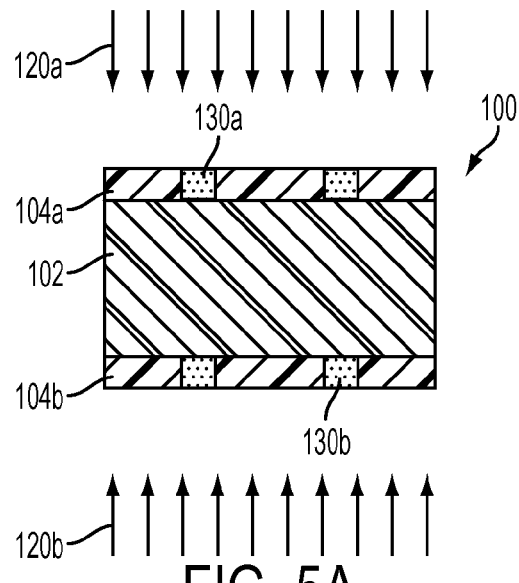
FIGS. 5A-5D schematically depict embodiments of additional machining steps performed on the glass structure of FIG. 3D, by which one embodiment is shown in FIGS. 5A and 5B in combination and another embodiment is shown in FIGS. 5A, 5C, and 5D in combination.
Figure 5B:
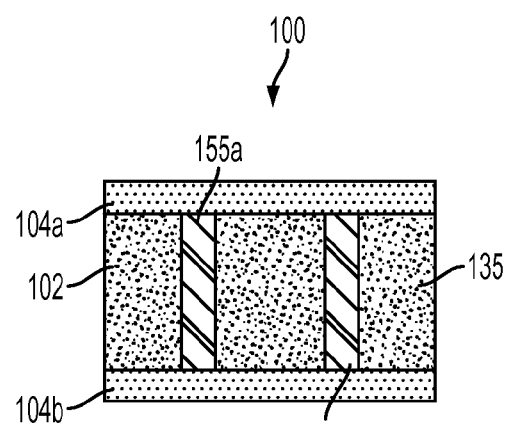

In some embodiments of methods for machining glass structures, a glass structure 100 having crystallized regions 130a, 130b, as depicted in FIGS. 3D and 5A, may be exposed again to radiation such as UV radiation 120a, 120b. When the glass structure 100, already having crystallized regions 130a, 130b, is further exposed to the radiation, the crystallized regions 130a, 130b may shield portions of the core layer 102 beneath or directly adjacent to the crystallized regions 130a, 130b from any exposure to the radiation. In some embodiments, the additional exposure to the UV radiation is conducted with suitable parameters such as intensity, wavelength, and duration that enable the core layer 102, the first cladding layer 104a, and the second cladding layer 104b to crystallize after heat treatment. For example, the glass structure 100 of FIG. 5B illustrates one embodiment of a structure that may result after heat treatment of the glass structure of FIG. 5A after exposure to radiation. In the glass structure 100 of FIG. 5B, the first cladding layer 104a and the second cladding layer 104b have crystallized entirely in all directions. The core layer 102 contains core crystallized regions 135 and core uncrystallized regions 155a, 155b. The core uncrystallized regions 155a, 155b may represent portions of the core layer 102 that were shadowed from UV radiation exposure by the crystallized regions 130a, 130b in the first cladding layer 104a and the second cladding layer 104b.

Figure 5C:
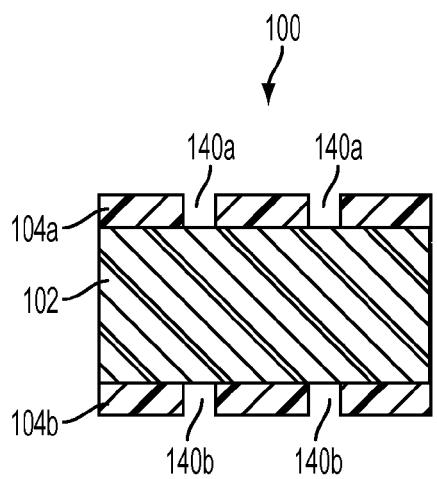

In other embodiments, the crystallized regions 130a, 130b of the first cladding layer 104a and the second cladding layer 104b may be removed from the glass structure 100 of FIG. 5A after the depicted UV exposure but before any heat treatment to result in the glass structure 100 of FIG. 5C. In such embodiments, the compositions of the first cladding layer 104a, the second cladding layer 104b, or both, may be chosen such that crystallization occurs only with UV exposure and subsequent heat treatment, not with UV exposure alone. The glass structure 100 of FIG. 5C formed in this manner may contain hole structures 140a, 140b. Thereupon, the glass structure 100 of FIG. 5C, in which all layers have already been exposed to UV radiation 120 as shown in FIG. 5A, may be subjected to heat treatment to result in the glass structure 100 of FIG. 5D.

Figure 5D:
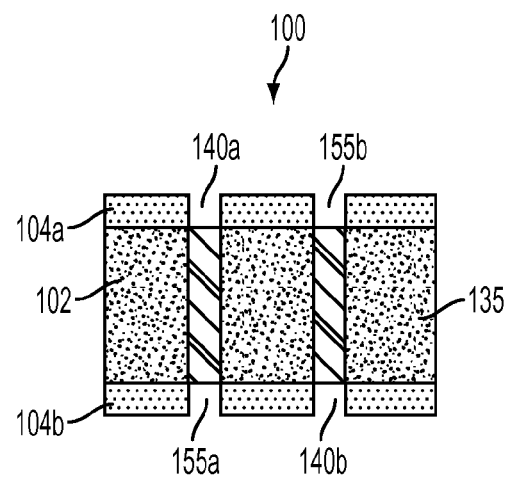

Similar to the glass structure 100 of FIG. 5B, in the glass structure 100 of FIG. 5D, all of the first cladding layer 104a and the second cladding layer 104b are crystallized, and the core layer 102 includes both core crystallized regions 135 and core uncrystallized regions 155a, 155b. Unlike the glass structure of FIG. 5B, however, in the glass structure 100 of FIG. 5D, hole structures 140a, 140b are present in the first cladding layer 104a and the second cladding layer 104b.

Referring now to FIGS. 6A-6E, further embodiments of methods for machining glass structures may additionally comprise subjecting the glass structure to an ion-exchange process. In some embodiments, the ion-exchange process may include replacing certain elements in the glass composition, such as sodium, for example, with other elements such as potassium, for example, to strengthen all or a portion of the glass composition. In some embodiments, the glass structure 100 of FIG. 6A, having hole structures 140a, 140b formed as described above, may be subjected to an ion-exchange process. As used herein, the term "ion-exchanged" is understood to mean that the glass is strengthened by ion exchange processes that are known to those skilled in the glass fabrication arts. Such ion exchange processes include, but are not limited to, treating the heated alkali aluminosilicate glass with a heated solution containing ions having a larger ionic radius than ions that are present in the glass surface, thus replacing the smaller ions with the larger ions. Potassium ions, for example, could replace sodium ions in the glass. Alternatively, other alkali metal ions having larger atomic radii, such as rubidium or cesium could replace smaller alkali metal ions in the glass. Similarly, other alkali metal salts such as, but not limited to, sulfates, halides, and the like may be used in the ion exchange process. In one embodiment, the down-drawn glass is chemically strengthened by placing it a molten salt bath comprising $KNO_3$ for a predetermined time period to achieve ion exchange. In one embodiment, the temperature of the molten salt bath is about 430° C., and the predetermined time period is about eight hours.

Figure 6A:
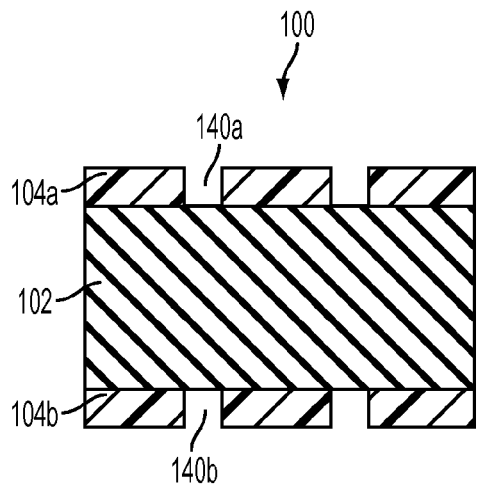
FIGS. 6A-6E schematically depict an embodiment of an ion-exchange processes performed on the glass structure of FIG. 4A.
Figure 6B:
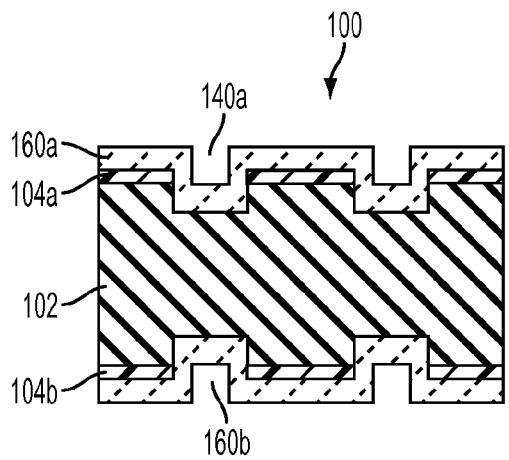
Figure 6C:
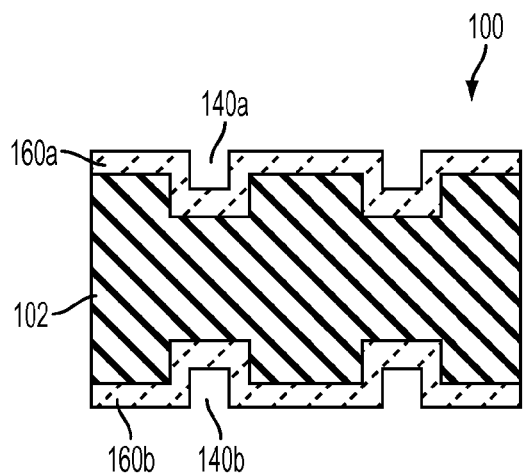
Figure 6D:
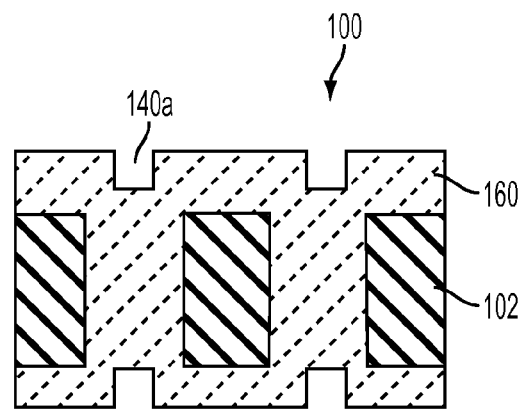
Figure 6E:
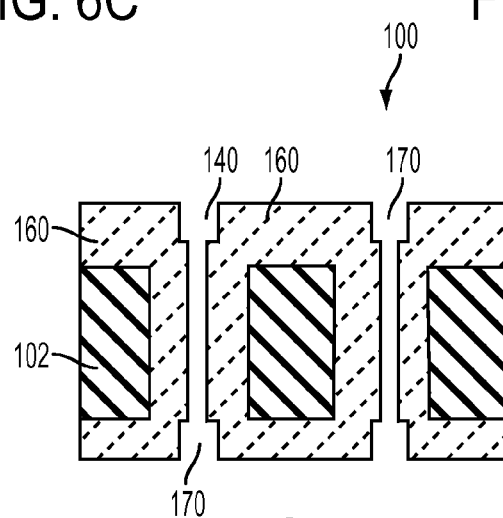

In the embodiment of FIG. 6B, for example, the ion-exchange process may continue until ion-exchanged regions 160a, 160b form in portions of the first-cladding layer 104a, the second cladding layer 104b, and even the core layer 102 near the hole structures 140a, 140b, but only for a predetermined time that does not result in ion exchange through the entire depth of the cladding layers 104a, 104b. In the embodiment of FIG. 6C, for example, the ion-exchange process may continue until the first-cladding layer 104a and the second cladding layer 104b are ion-exchanged regions 160a, 160b, and the ion-exchanged regions 160a, 160b optionally may extend into the core layer 102. In the embodiment of FIG. 6D, for example, the ion-exchange process may continue until the ion-exchanged layer 160 is contiguous throughout the glass structure 100, such that all portions of the first-cladding layer 104a and the second cladding layer 104b are ion-exchanged and regions of the core layer 102 extending through the entire depth of the core layer 102 are also ion exchanged. In some embodiments, referring to FIG. 6E, the ion-exchanged region 160 is contiguous throughout the glass structure 100, and in the regions of the glass structure 100 in which the core layer 102 is ion-exchanged throughout its entire depth, the glass structure may be broken at break lines 170 that may readily form in the ion-exchanged portions of the core layer 102. Ion exchange processes and suitable exemplary glass compositions amenable to the ion exchange processes are described in U.S. Pat. No. 7,666,511, which is incorporated herein by reference in its entirety.

Figure 7A:
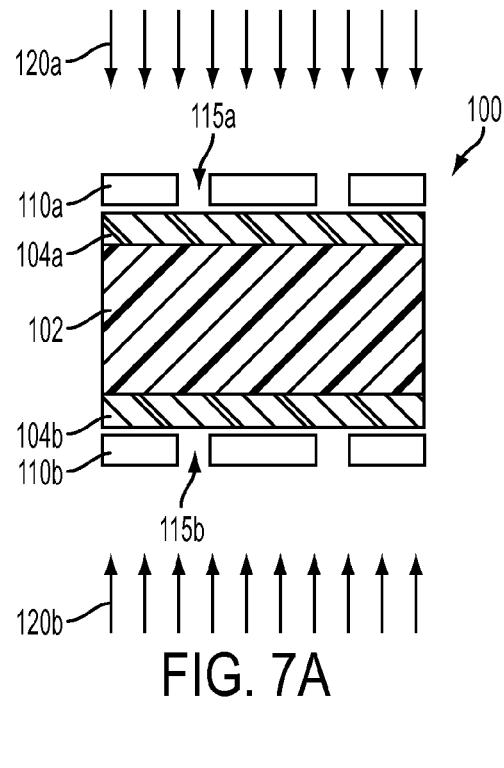
FIGS. 7A-7E schematically depict an embodiment of a method for machining the glass structure of FIG. 1, in which the core layer has a higher photosensitivity than the cladding layers.

Referring now to FIGS. 7A-7E, in some embodiments of methods for machining glass structures, the core layer 102 may have a core photosensitivity greater than the first-clad photosensitivity of the first cladding layer 104a. In such embodiments, the core photosensitivity may also be greater than the second-clad photosensitivity of the second cladding layer 104b. Thereby, when the glass structure 100 of FIG. 7A is exposed to radiation such as UV radiation 120a, 120b through photomasks such as first photomask 110a with apertures 115a and second photomask 110b with apertures 115b, for a suitable time and at a suitable wavelength and intensity, heat treatment of the glass structure may result in the glass structures of FIG. 7B or FIG. 7D, for example. In such embodiments, optionally the UV radiation 120 may be focused through the first cladding layer 104a to result in a narrow column of UV exposure to the core layer 102.

Figure 7B:
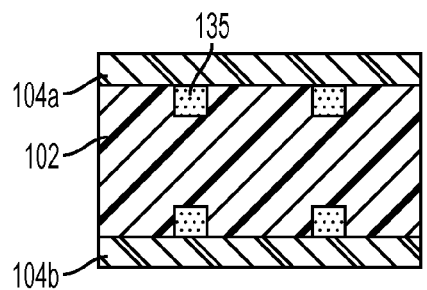
Figure 7C:
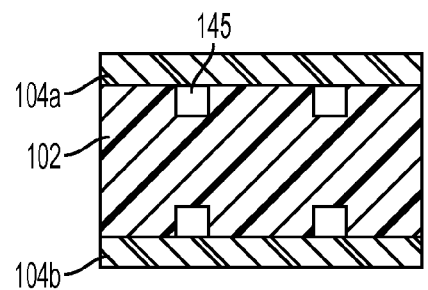
Figure 7D:
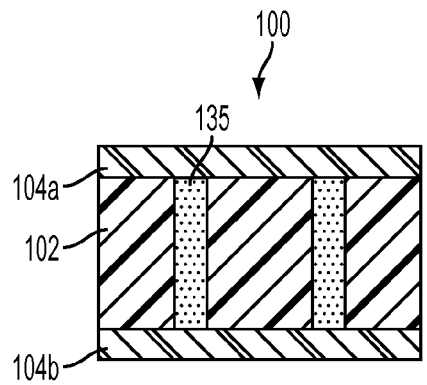
Figure 7E:
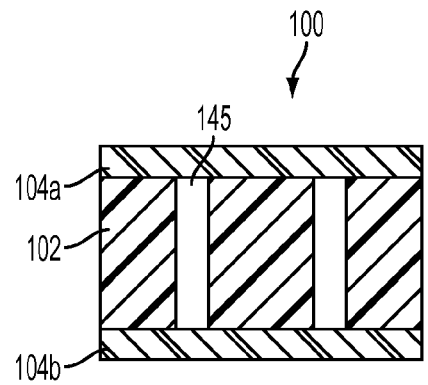

As illustrative of the embodiments in which the core photosensitivity greater than the first-clad photosensitivity of the first cladding layer 104a, in the glass structure 100 of FIG. 7B, the radiation exposure was not sufficient to enable crystallization of the core layer 102 to form core crystallized regions 135 extending all the way through the core layer 102. In some embodiments, the core crystallized regions 135 may be removed by a suitable technique such as etching, for example, to form the glass structure 100 of FIG. 7C having removed core portions 145. If etching is used, in some embodiments it may be necessary to provide a route for the etchant to reach the core crystallized regions 135. In such embodiments, optionally an additional physical treatment such laser drilling may be conducted to form a hole or void in the cladding layers 104a, 104b. In the glass structure 100 of FIG. 7D, the radiation exposure provided to the glass structure 100 of FIG. 7A was sufficient to enable crystallization of the core layer 102 to form core crystallized regions 135 extending all the way through the core layer 102. Thus, the removed core portions 145 extend through the entire depth of the core layer 102 from the first cladding layer 104a to the second cladding layer 104b.

Figure 8A:
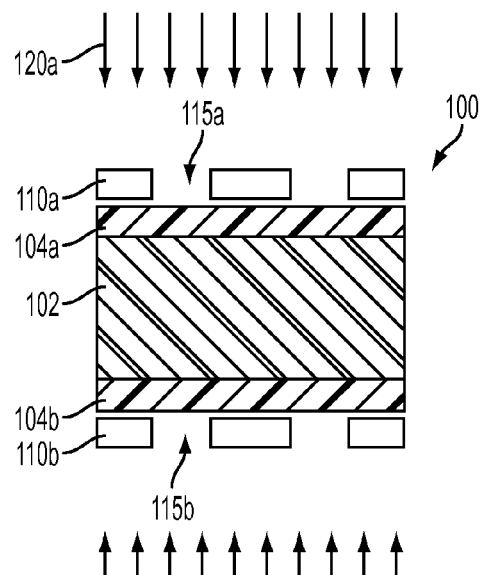
FIGS. 8A-8F schematically depict an embodiment of a method for machining the glass structure of FIG. 1 to form complex structures including through-holes.
Figure 8B:
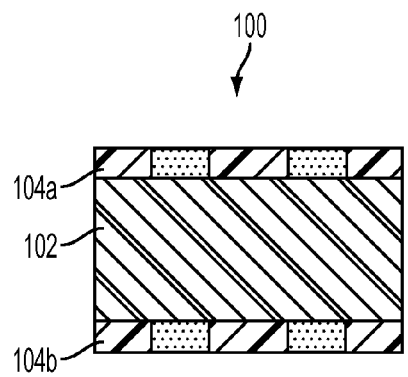
Figure 8C:
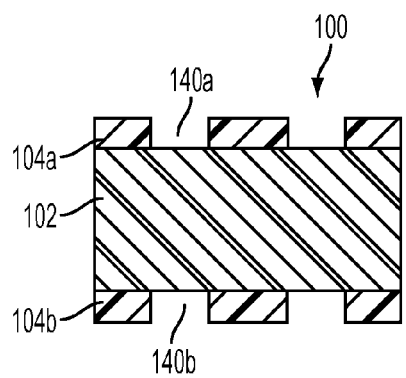
Figure 8D:
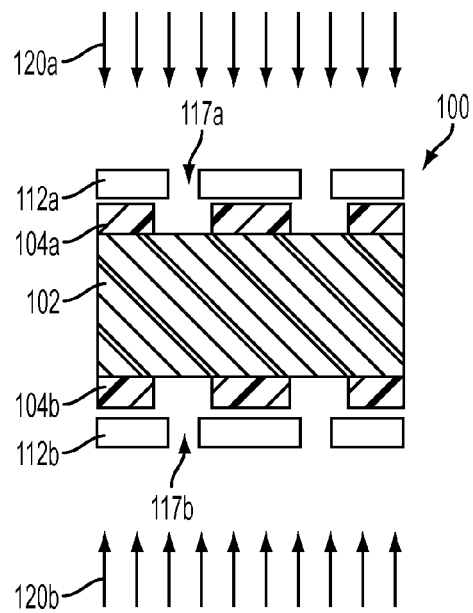
Figure 8E:
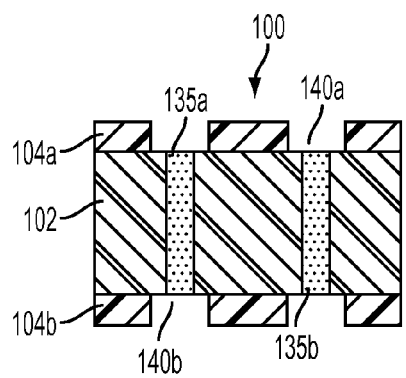
Figure 8F:
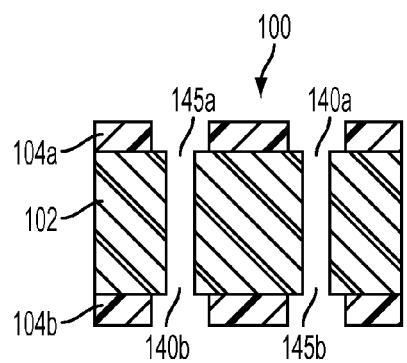

Referring now to FIGS. 8A-8F, exemplary embodiments of methods for machining glass structures may incorporate multiple radiation exposures and/or heat treatments. to form complex shapes and through-holes. In the non-limiting illustrative embodiments of FIGS. 8A-8F, the core photosensitivity is less than the first-clad photosensitivity and the second-clad photosensitivity. Preparation of the glass structure 100 of FIG. 8C by exposing the glass structure 100 of FIG. 8A to radiation, then heat treating to form the glass structure 100 of FIG. 8B, then removing crystallized regions 130a, 130b, has been described in detail above. According to some embodiments, the methods may include exposing the glass structure of FIG. 8C to radiation a second time, as shown in FIG. 8D, such that the radiation traverses the hole structures 140a, 140b in the cladding layers 104a, 104b and penetrates only the core layer 102.

In the photomasks 110a, 110b of FIG. 8A, the apertures 115a, 115b are wider than the apertures 117a, 117b of the photomasks 112a, 112b of FIG. 8D. When the exposure process of FIG. 8D is conducted, the UV radiation no longer enters the cladding layers 104a, 104b, because the portions of the cladding layers 104a, 104b visible through the photomasks 112a, 112b have already been removed. Thereby, when the glass structure 100 of FIG. 8D is heat treated, the glass structure 100 of FIG. 8E may be formed. In the glass structure of FIG. 8E, the cladding layers 104a, 104b contain hole structures 140a, 140b, and the core layer 102 contains core crystallized regions 135a, 135b extending from hole structures 140a, 140b on opposite sides of the glass structure 100. In some embodiments, the core crystallized regions 135a, 135b may be removed by a suitable technique such as etching, for example, to form the glass structure 100 of FIG. 8F. In the glass structure 100 of FIG. 8F, removed core portions 145a, 145b are through-holes or via holes that connect the hole structures 140a, 140b in the cladding layers 104a, 104b on opposite sides of the glass structure 100.

Figure 9A:
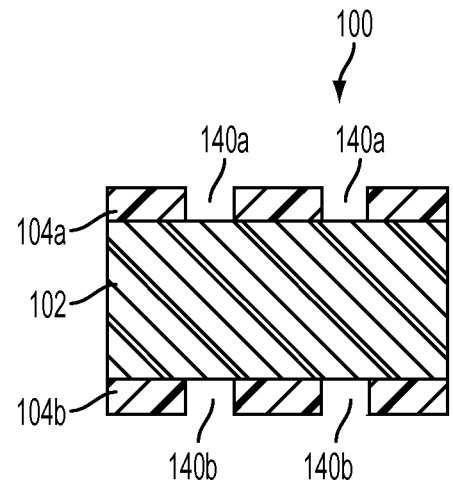
FIGS. 9A-9B schematically depict a surface roughening step performed in an embodiment of a method for machining the glass structure of FIG. 1.
Figure 9B:
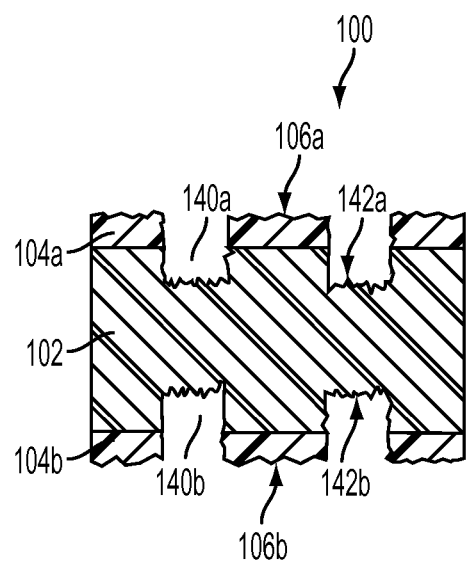

Referring now to FIGS. 9A and 9B, exemplary embodiments of methods for machining glass structures may further include surface treatments such as etching or surface roughening to the glass structures. Illustrative routes for preparing the glass structure 100 of FIG. 9A have been described above. In some embodiments, the glass structure 100 of FIG. 9A may be etched or roughened to produce the glass structure 100 of FIG. 9B. In the glass structure 100 of FIG. 9B, the cladding layers 104a, 104b contain roughened cladding surfaces 106a, 106b. The hole structures 140a, 140b include roughened hole surfaces 142a, 142b. Depending on an etching time, the etching treatment used, and the identity and concentration of the etchant, the hole structures 140a, 140b that existed only in the cladding layers 104a, 104b of the glass structure 100 of FIG. 9A may be made to extend to a desired depth into the core layer 102, as in the glass structure 100 of FIG. 9B.

Figure 10A:
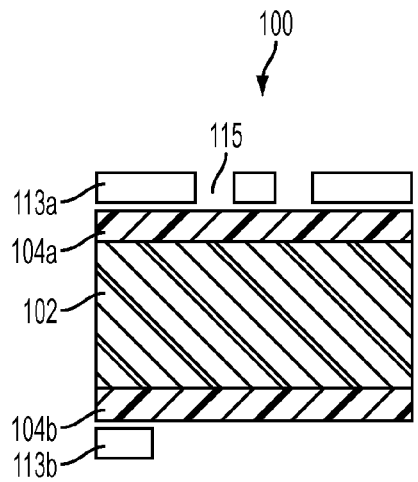
FIGS. 10A-10E schematically depict an embodiment of a method for machining the glass structure of FIG. 1, in which the glass structure is machined into a component that may be used in a tactile interface.
Figure 10B:
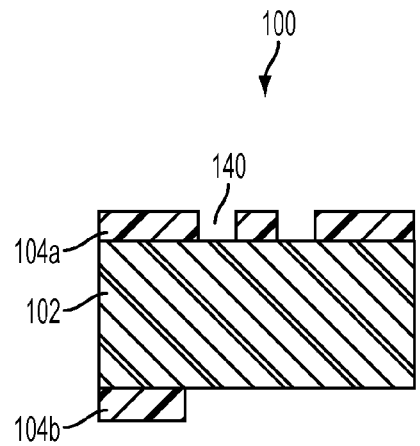
Figure 10C:
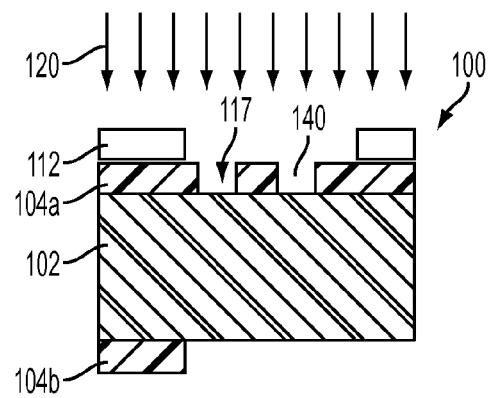

Referring now to FIGS. 10A-10E, in an illustrative embodiment, the methods described herein may be used to form a glass structure 100 into a fluidic component such as the tactile interface described in U.S. Pat. No. 8,179,375, incorporated herein by reference. In the embodiments of FIGS. 10A-10E, however, the cladding layers 104a, 104b may be formed from a fast-etch glass that may be, but need not be, photosensitive or photomachinable. The fast-etch glass may be any glass composition that can be fusion-drawn with a photomachinable glass composition as described above, in particular with a photomachinable core layer. In some embodiments, the fast-etch glass composition may have an etch rate or solubility in an etchant such as hydrofluoric acid that is at least 1.5 times greater, at least 2 times greater, at least 5 times greater, at least 10 times greater, at least 20 times greater, or at least 100 times greater than the same characteristic of the photomachinable core layer. In some embodiments, suitable fast-etch glasses may include those described in U.S. Pat. No 4,880,453, which is incorporated herein by reference in its entirety. Each of the fast-etch glasses of U.S. Pat. No 4,880,453 is believed to have a photosensitivity of zero or nearly zero. Other exemplary fast-etch glass compositions suitable for use herein are listed in TABLE 2, of which some compositions may be photosensitive and/or photomachinable and others may be neither photosensitive nor photomachinable:

The glass structure 100 of FIG. 10A includes a core layer 102 of a photomachinable glass composition interposed between a first cladding layer 104a and a second cladding layer 104b. Both cladding layers 104a, 104b are formed from the fast-etch glass compositions described above and may be formed from the same material or different materials. Masking layers 113a, 113b may be applied to cover the cladding layers 104a, 104b. In some embodiments, the masking layers 113a, 113b may be photomasks, whereby the cladding layers 104a, 104b may be entirely coated with the masking layers 113a, 113b, the masking layers may be cured under radiation such as UV radiation, and portions of the masking layers 113a, 113b may be removed to expose portions of the cladding layers 104a, 104b to be etched. In other embodiments, the masking layers 113a, 113b may be selectively applied over portions of the cladding layers 104a, 104b not intended to be etched away. Regardless, portions of the cladding layers 104a, 104b not covered by the masking layers 113a, 113b, such as those portions within apertures 115 of the masking layer 113a, may be removed by a suitable technique such as laser drilling or wet or dry etching. The removal of the portions of the cladding layers 104a, 104b may result in the glass structure of FIG. 10B, in which hole structures 140 are present in the first cladding layer 104a and the core layer 102 is exposed after a portion of the second cladding layer 104b has been removed. In the embodiment of FIG. 10C, a photomask 112 having an aperture 117 may be placed over the first cladding layer 104a, and the core layer 102 may be exposed to radiation such as UV radiation 120 through the aperture 117. Heat treatment of the glass structure of FIG. 10C may produce the glass structure 100 of FIG. 10D, in which a core crystallized region 135 has formed in the portion of the core layer 102 that has been exposed to the UV radiation 120. The core layer 102 of FIG. 10D also includes core non-crystallized regions 155 in portions of the core layer 102 underneath the photomask 112 during the exposure to the UV radiation.

Figure 10D:
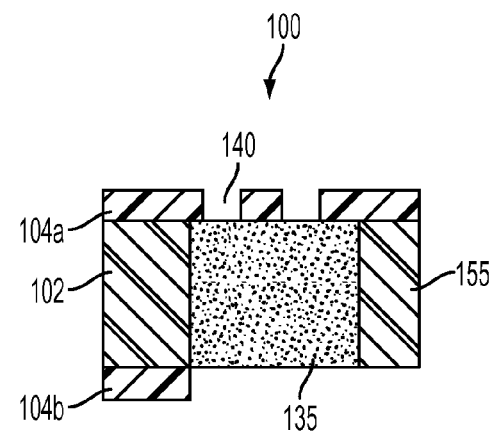
Figure 10E:
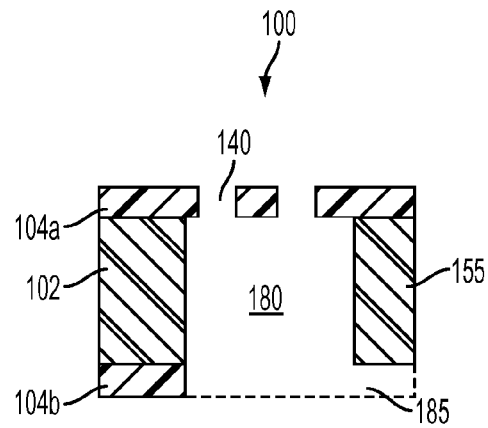

The core crystallized region 135 may be removed from the glass structure 100 of FIG. 10D by a suitable technique, such as the selective etching described above, to result in the glass structure of FIG. 10E. The glass structure of FIG. 10E includes the hole structures 140 in the first cladding layer 104, a hollow chamber 180, and a fluidic channel 185. When used as the tactile user interface described in U.S. Pat. No. 8,179,375, the hollow chamber 180 may be filled with a fluid such as water, for example and covered with an elastomeric sheet. The cavity may be designed to have two volumetric settings: a retracted volume setting and an extended volume setting. When the displacement device expands the cavity outward, a button-like shape is formed. With the button-like shape, the user will have tactile guidance when providing input to the touch-enabled electronic device.

TABLE 2

Exemplary fast-etch glass compositions

| | 1 (Wt %) | 2 (Wt %) | 3 (Wt %) | 4 (Wt %) | 5 (Wt %) | 6 (Wt %) | 7 (Wt %) | 8 (Wt %) | 9 (Wt %) | 10 (Wt %) | 11 (Wt %) | 12 (Wt %) | 13 (Wt %) |
|---|---|---|---|---|---|---|---|---|---|---|---|---|---|
| SiO2 | 49.3 | 46.2 | 47.5 | 45.6 | 43.8 | 42.0 | 49.3 | 49.3 | 49.8 | 50.3 | 50.7 | 51.2 | 49.6 |
| Al2O3 | 27.6 | 25.8 | 27.5 | 27.5 | 27.4 | 27.4 | 27.6 | 27.6 | 27.9 | 28.1 | 28.4 | 28.7 | 27.7 |
| B2O3 | 5.0 | 4.7 | 7.0 | 9.0 | 10.9 | 12.9 | 5.0 | 5.0 | 5.1 | 5.1 | 5.2 | 5.2 | 5.0 |
| Li2O | 0.0 | 0.0 | 0.0 | 0.0 | 0.0 | 0.0 | 0.0 | 0.0 | 0.9 | 1.8 | 2.7 | 3.6 | 0.0 |
| Na2O | 16.7 | 18.6 | 16.6 | 16.6 | 16.5 | 16.5 | 16.7 | 16.7 | 15.0 | 13.3 | 11.6 | 9.9 | 16.8 |
| K2O | 0.7 | 0.6 | 0.7 | 0.7 | 0.7 | 0.7 | 0.7 | 0.7 | 0.7 | 0.7 | 0.7 | 0.7 | 0.7 |
| SnO2 | 0.2 | 0.2 | 0.2 | 0.2 | 0.2 | 0.0 | 0.2 | 0.2 | 0.2 | 0.2 | 0.2 | 0.2 | 0.2 |
| ZrO2 | 0.04 | 0.03 | 0.04 | 0.04 | 0.04 | 0.04 | 0.04 | 0.04 | 0.04 | 0.04 | 0.04 | 0.04 | 0 |

Thus, methods have been described for machining glass structures that include fusion-drawn core-clad laminates that include at least one photomachinable layer. The methods described herein may be used in numerous ways to fabricate machined laminate structures that may be useful in optical and electronic applications, for example.

It should be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. A method for machining a glass structure, wherein:
   the glass structure comprises a fusion-drawn laminate of a core layer interposed between a first cladding layer and a second cladding layer;
   the core layer is formed from a core glass composition having a nonzero core photosensitivity;
   the first cladding layer is formed from a first-clad glass composition having a first-clad photosensitivity different from the core photosensitivity;
   the second cladding layer is formed from a second-clad glass composition having a second-clad photosensitivity different from the core photosensitivity; and
   at least one of the core layer, the first cladding layer, and the second cladding layer is a photomachinable layer,
   the method comprising:
   exposing at least one selected region of at least one photomachinable layer in the fusion-drawn laminate to ultraviolet radiation for a predetermined exposure time;
   heating the glass structure until the at least one selected region forms a crystallized region of crystallized material in the photomachinable layer; and
   removing the crystallized region selectively from the photomachinable layer.

2. The method of claim 1, wherein:
   each of the core layer, the first cladding layer, and the second cladding layer are photomachinable layers; and
   the first-clad photosensitivity and the second-clad photosensitivity are both greater than the core photosensitivity.

3. The method of claim 1, wherein:
   a first plurality of selected regions of the first cladding layer and a second plurality of selected regions of the second cladding layer are exposed to the ultraviolet radiation; and
   during the heating the first plurality of selected regions form crystallized regions in the first cladding layer and the second plurality of selected regions form crystallized regions in the second cladding layer.

4. The method of claim 3, wherein the exposing is conducted through at least one photomask having apertures that define the first plurality of selected regions, the second plurality of selected regions, or both.

5. The method of claim 4, further comprising:
   exposing the glass structure to ultraviolet radiation a second time after heating the glass structure and before removing the crystallized region, such that a first portion of the core layer is shielded from the ultraviolet radiation by the crystallized region and a second portion of the core layer is not shielded from the ultraviolet radiation; and
   heating the glass structure until the unshielded portion of the core layer crystallizes.

6. The method of claim 5, wherein the crystallized region is removed after exposing the glass structure to ultraviolet radiation the second time and before heating the glass structure until the unshielded portion of the core layer crystallizes.

7. The method of claim 4, wherein the first plurality of selected regions and the second plurality of selected regions are vertically aligned, the method further comprising removing portions of the core layer between the first plurality of selected regions and the second plurality of selected regions to form through-holes through the glass structure.

8. The method of claim 4, wherein removing the crystallized region forms hole structures in the first cladding layer, the second cladding layer, or both.

9. The method of claim 8, further comprising:
   exposing the glass structure to ultraviolet radiation a second time after heating the glass structure and removing the crystallized region through a photomask having apertures that are aligned with the hole structures and are smaller than hole structures; and
   heating the glass structure after the second exposure until at least a core crystallized region of the core layer crystallizes.

10. The method of claim 9, further comprising removing the core crystallized region to form at least one through-hole extending from hole structures on opposite sides of the glass structure.

11. The method of claim 8, further comprising etching surfaces of the first cladding layer, the second cladding layer, and the hole structures to form roughened cladding surfaces on the first cladding layer and the second cladding layer and roughened hole surfaces in the hole structures.

12. The method of claim 1, further comprising subjecting the glass structure to an ion-exchange process after the crystallized region is removed.

13. The method of claim 12, wherein subjecting the glass structure to the ion-exchange process comprises continuing the ion-exchange process at least until the first cladding layer and the second cladding layer are ion-exchanged through their entire thicknesses.

14. The method of claim 12, wherein subjecting the glass structure to the ion-exchange process comprises continuing the ion-exchange process at least until a contiguous ion-exchange layer is formed including portions of the first cladding layer, the second cladding layer, and the core layer.

15. The method of claim 14, further comprising breaking the glass structure at break lines formed in ion-exchanged regions of the core layer.

16. The method of claim 1, wherein the first-clad photosensitivity and the second-clad photosensitivity are both less than the core photosensitivity.

17. The method of claim 16, wherein the crystallized region forms in the core layer and not in the first cladding layer or the second cladding layer.

18. The method of claim 16, further comprising drilling through the first cladding layer, the second cladding layer, or both, to provide access for etchant to reach the crystallized region in the core layer.

19. The method of claim 1, wherein the first-clad photosensitivity and the second-clad photosensitivity are both zero; and the first-clad glass composition and the second-clad glass composition are fast-etch glass compositions each having clad solubilities in an etchant at least 1.5 times a core solubility of the core glass composition in the etchant.

20. The method of claim 19, further comprising before exposing the photomachinable layer to the ultraviolet radiation:

applying a masking layer over at least a portion of the first cladding layer, the second cladding layer, or both; and removing portions of the first cladding layer, the second cladding layer, or both, that are not covered by the masking layer.

* * * * *